United States Patent
Lu et al.

(10) Patent No.: US 9,543,355 B2
(45) Date of Patent: Jan. 10, 2017

(54) DARK CURRENT REDUCTION FOR BACK SIDE ILLUMINATED IMAGE SENSOR

(71) Applicant: TAIWAN SEMICONDUCTOR MANUFACTURING COMPANY, LTD., Hsin-Chu (TW)

(72) Inventors: Shou-Shu Lu, Kaohsiung (TW); Hsun-Ying Huang, Tainan (TW); Hsin-Jung Huang, Kaohsiung (TW); Chun-Mao Chiu, Kaohsiung (TW); Chia-Chi Hsiao, Tianzhong Township (TW); Yung-Cheng Chang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/822,051

(22) Filed: Aug. 10, 2015

(65) Prior Publication Data

US 2015/0349009 A1 Dec. 3, 2015

Related U.S. Application Data

(60) Continuation of application No. 14/323,676, filed on Jul. 3, 2014, now Pat. No. 9,123,616, which is a
(Continued)

(51) Int. Cl.
*H01L 27/146* (2006.01)
*H01L 31/028* (2006.01)

(52) U.S. Cl.
CPC ..... *H01L 27/14687* (2013.01); *H01L 27/1462* (2013.01); *H01L 27/1464* (2013.01);
(Continued)

(58) Field of Classification Search
CPC .............. H01L 27/14687; H01L 27/14618; H01L 27/1462; H01L 27/14632; H01L 27/14636; H01L 27/1464; H01L 27/14683; H01L 27/14685; H01L 27/14621; H01L 27/14627; H01L 31/028; H01L 2924/0002
See application file for complete search history.

(56) References Cited

U.S. PATENT DOCUMENTS

| 7,741,666 B2 | 6/2010 | Nozaki et al. |
| 8,848,075 B2 | 9/2014 | Takahashi et al. |
| 2011/0102657 A1* | 5/2011 | Takahashi ............. H01L 23/481 348/308 |

FOREIGN PATENT DOCUMENTS

| CN | 102769021 A | 11/2012 |
| KR | 10-2008-0079490 A | 9/2008 |

(Continued)

OTHER PUBLICATIONS

Korean Intellectual Property Office, Notice of Allowance for Patent Application No. 10-2012-0039403, Nov. 24, 2014, 4 pages.

*Primary Examiner* — Whitney T Moore
(74) *Attorney, Agent, or Firm* — Haynes and Boone, LLP

(57) ABSTRACT

A method of fabricating a semiconductor image sensor device is disclosed. A plurality of radiation-sensing regions is formed in a substrate. The radiation-sensing regions are formed in a non-scribe-line region of the image sensor device. An opening is formed in a scribe-line region of the image sensor device by etching the substrate in the scribe-line region. A portion of the substrate remains in the scribe-line region after the etching. The opening is then filled with an organic material.

20 Claims, 9 Drawing Sheets

Related U.S. Application Data division of application No. 13/305,069, filed on Nov. 28, 2011, now Pat. No. 8,772,895.

(52) U.S. Cl.
CPC .. *H01L 27/14618* (2013.01); *H01L 27/14632* (2013.01); *H01L 27/14636* (2013.01); *H01L 27/14683* (2013.01); *H01L 27/14685* (2013.01); *H01L 31/028* (2013.01); *H01L 27/14621* (2013.01); *H01L 27/14627* (2013.01); *H01L 2924/0002* (2013.01)

(56) References Cited

FOREIGN PATENT DOCUMENTS

| KR | 10-2009-0072255 A | 2/2009 |
|---|---|---|
| TW | 201030956 | 8/2010 |

\* cited by examiner

DARK CURRENT REDUCTION FOR BACK SIDE ILLUMINATED IMAGE SENSOR

PRIORITY DATA

The present application is a continuation patent application of U.S. patent application Ser. No. 14/323,676, filed on Jul. 3, 2014, which is a divisional patent application of U.S. patent application Ser. No. 13/305,069, filed on Nov. 28, 2011, now U.S. Pat. No. 8,772,895 issued Jul. 8, 2014, the disclosures of each are hereby incorporated by reference in their entirety.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

A back side illuminated (BSI) image sensor device is one type of image sensor device. These BSI image sensor devices are operable to detect light projected from the backside. The BSI image sensor devices include color filters for filtering a specific wavelength band of the incoming light, which corresponds to a color in a color spectrum. However, conventional methods of forming color filters for BSI image sensor devices have been prone to suffer from thermal expansion issues, particular in a scribe line region of the BSI image sensor device. Such thermal expansion may cause lateral stress to a photo-sensitive region of the image sensor and degrade dark current performance of the image sensor.

Therefore, while existing semiconductor image sensors have been generally adequate for their intended purposes, they are not entirely satisfactory in every aspect.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
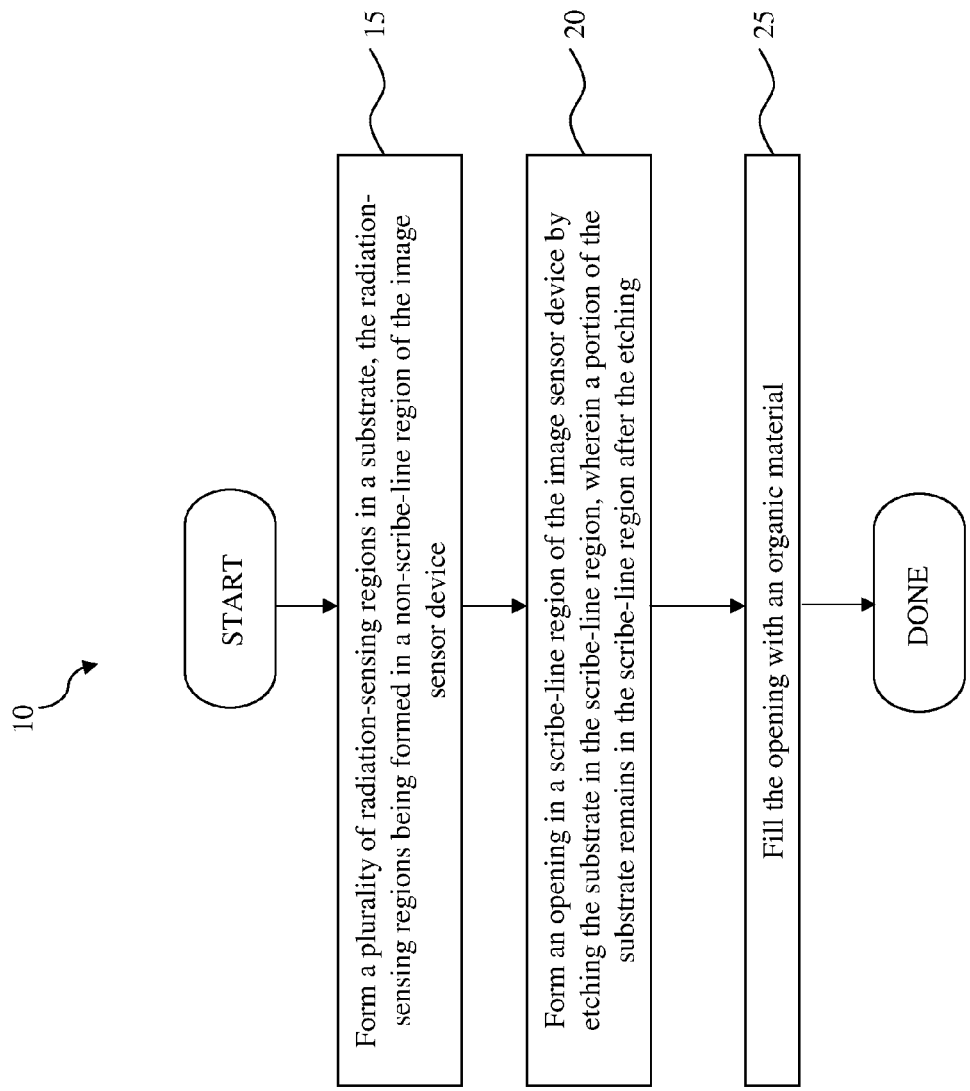
FIG. 1 is a flowchart illustrating a method for fabricating an image sensor device according to various aspects of the present disclosure.

Illustrated in FIG. 1 is a flowchart of a method 10 for fabricating a semiconductor image sensor device according to various aspects of the present disclosure. Referring to FIG. 1, the method 10 includes block 15 in which a plurality of radiation-sensing regions is formed in a substrate. The radiation-sensing regions are formed in a non-scribe-line region of the image sensor device. The method 10 includes block 20 in which an opening is formed in a scribe-line region of the image sensor device. The opening is formed etching the substrate in the scribe-line region. A portion of the substrate remains in the scribe-line region after the etching. The method 10 includes block 25 in which the opening is filled with an organic material. It is understood that additional processing steps may be performed before, during, or after the method 10 of FIG. 1. But for the sake of simplicity, these additional processing steps are not discussed in detail herein.

FIGS. 2 to 9 are diagrammatic fragmentary sectional side views of various embodiments of an apparatus that is a back side illuminated (BSI) image sensor device 30 at various stages of fabrication according to aspects of the method 10 of FIG. 1. The image sensor device 30 includes an array or grid of pixels for sensing and recording an intensity of radiation (such as light) directed toward a back-side of the image sensor device 30. The image sensor device 30 may include a charge-coupled device (CCD), complimentary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 9 have been simplified for a better understanding of the inventive concepts of the present disclosure and may not be drawn to scale.

Figure 2:
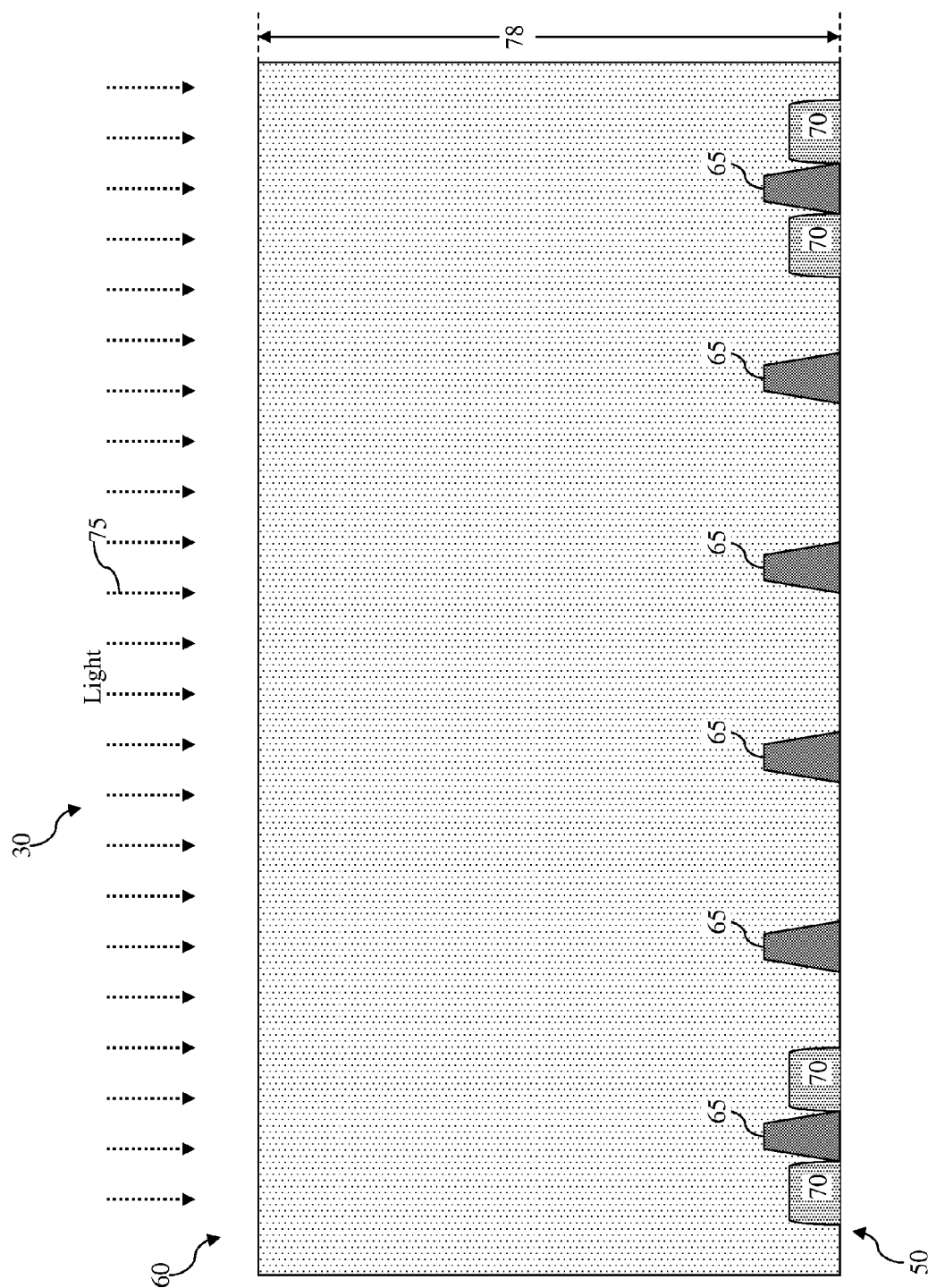
FIGS. 2-9 are diagrammatic fragmentary cross-sectional side views of an image sensor device at various stages of fabrication in accordance with various aspects of the present disclosure.

With reference to FIG. 2, the image sensor device 30 includes a substrate 40, hereinafter referred to as a device substrate. The device substrate 40 is a silicon substrate doped with a p-type dopant such as Boron (for example a p-type substrate). Alternatively, the device substrate 40 could be another suitable semiconductor material. For example, the device substrate 40 may be a silicon substrate that is doped with an n-type dopant such as Phosphorous or Arsenic (an n-type substrate). The device substrate 40 could include other elementary semiconductors such as germanium and diamond. The device substrate 40 could optionally include a compound semiconductor and/or an alloy semiconductor. Further, the device substrate 40 could include an epitaxial layer (epi layer), may be strained for performance enhancement, and may include a silicon-on-insulator (SOI) structure.

Referring back to FIG. 2, the device substrate 40 has a front side (also referred to as a front surface) 50 and a back side (also referred to as a back surface) 60. For a BSI image sensor device such as the image sensor device 30, radiation is projected from the back side 60 and enters the substrate 40 through the back surface.

A plurality of dielectric trench isolation (STI) structures 65 is formed in the substrate 40. In some embodiments, the STI structures 65 are formed by the following process steps: etching openings into the substrate 40 from the front side 50; filling the openings with a dielectric material such as silicon oxide, silicon nitride, silicon oxynitride, a low-k material, or another suitable dielectric material; and thereafter performing a polishing process—for example a chemical mechanical polishing (CMP) process—to planarize the surface of the dielectric material filling the openings. In some embodiments, deep trench isolation (DTI) structures may be formed. The formation processes for the DTI structures may be similar to the STI structures 65, though the DTI structures are formed to have greater depths than the STI structures 65. In certain embodiments, doped isolation structures may also be formed. These doped isolation structures may be formed by one or more ion implantation processes. The doped isolation structures may be formed to replace or to supplement the STI or DTI structures.

A plurality of pixels is formed in the substrate 40. The pixels contain radiation-sensing doped regions 70. These radiation-sensing doped regions 70 are formed by one or more ion implantation processes or diffusion processes and are doped with a doping polarity opposite from that of the substrate 40 (or the doped region 140). Thus, in the embodiment illustrated, the pixels contain n-type doped regions. For a BSI image sensor device such as the image sensor device 30, the pixels are operable to detect radiation, such as an incident light 75, that is projected toward device substrate 40 from the back side 60.

In some embodiments, the pixels each include a photodiode. A deep implant region may be formed below each photodiode in some embodiments. In other embodiments, the pixels may include pinned layer photodiodes, photogates, reset transistors, source follower transistors, and transfer transistors. The pixels may also be referred to as radiation-detection devices or light-sensors. The pixels may be varied from one another to have different junction depths, thicknesses, widths, and so forth. In some embodiments, each pair of adjacent or neighboring pixels are separated from each other by a respective one of the isolation structures (e.g., STI structures 65) discussed above. The isolation structures 65 prevent or reduce cross-talk between the pixels.

The device substrate 40 also has an initial thickness 78, which is measured from the front side 50 to the back side 60. In some embodiments, the initial thickness 78 is in a range from about 100 microns (um) to about 3000 um, for example between about 500 um and about 1000 um.

Figure 3:
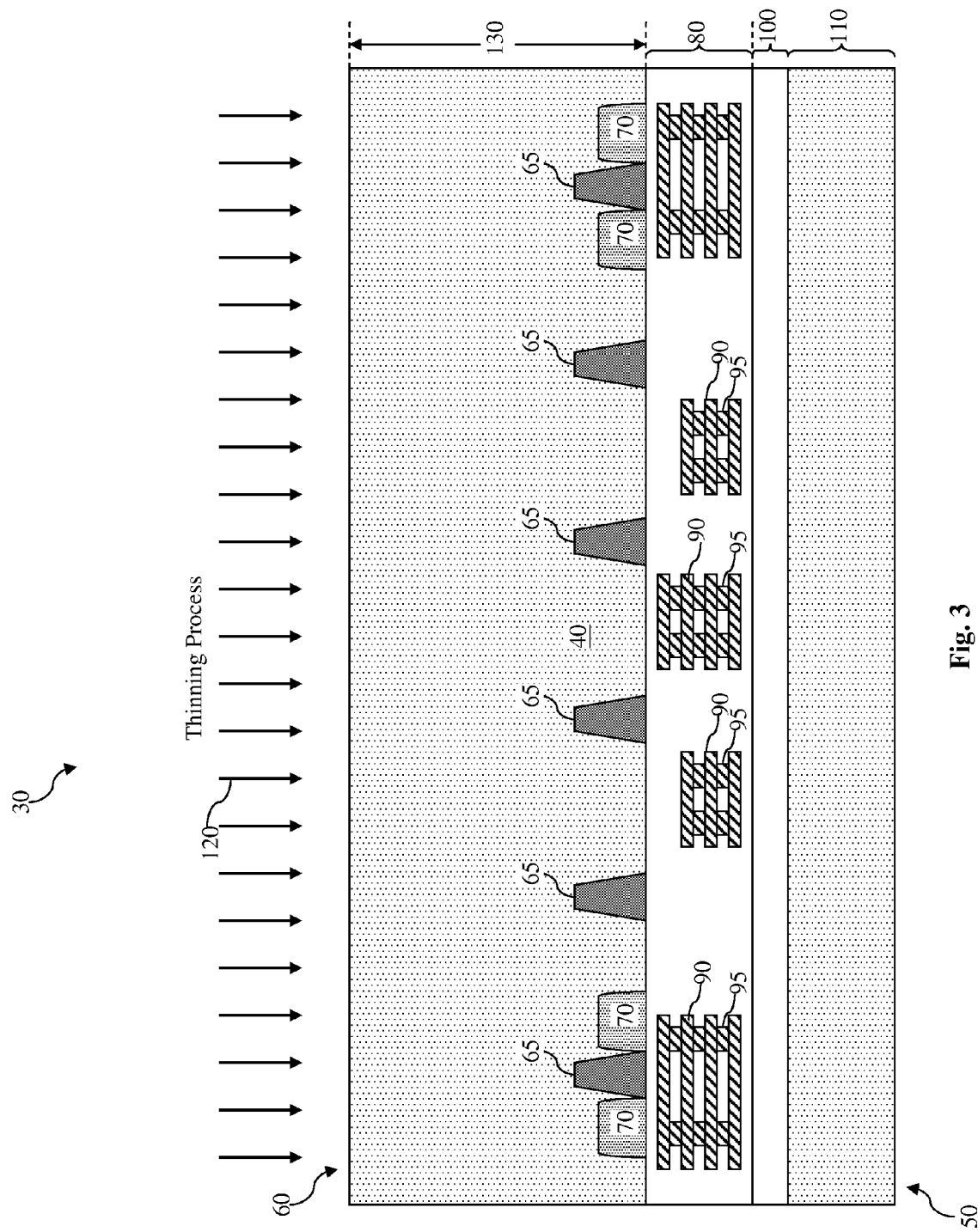

Referring now to FIG. 3, an interconnect structure 80 is formed over the front side 50 of the device substrate 40. The interconnect structure 80 includes a plurality of patterned dielectric layers and conductive layers that provide interconnections (e.g., wiring) between the various doped features, circuitry, and input/output of the image sensor device 30. The interconnect structure 80 includes an interlayer dielectric (ILD) and a multilayer interconnect (MLI) structure. The MLI structure includes contacts, vias and metal lines. For purposes of illustration, a plurality of conductive lines 90 and vias/contacts 95 are shown in FIG. 3, it being understood that the conductive lines 90 and vias/contacts 95 illustrated are merely examples, and the actual positioning and configuration of the conductive lines 90 and vias/contacts 95 may vary depending on design needs and manufacturing concerns.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 95) and horizontal connection (for example, conductive lines 90). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 3, a buffer layer 100 is formed on the interconnect structure 80. In the present embodiment, the buffer layer 100 includes a dielectric material such as silicon oxide. Alternatively, the buffer layer 100 may optionally include silicon nitride. The buffer layer 100 is formed by CVD, PVD, or other suitable techniques. The buffer layer 100 is planarized to form a smooth surface by a CMP process.

Thereafter, a carrier substrate 110 is bonded with the device substrate 40 through the buffer layer 100, so that processing of the back side 60 of the device substrate 40 can be performed. The carrier substrate 110 in the present embodiment is similar to the substrate 40 and includes a silicon material. Alternatively, the carrier substrate 110 may include a glass substrate or another suitable material. The carrier substrate 110 may be bonded to the device substrate 40 by molecular forces—a technique known as direct bonding or optical fusion bonding—or by other bonding techniques known in the art, such as metal diffusion or anodic bonding.

Referring back to FIG. 3, the buffer layer 100 provides electrical isolation between the device substrate 40 and the carrier substrate 110. The carrier substrate 110 provides protection for the various features formed on the front side 50 of the device substrate 40, such as the pixels formed therein. The carrier substrate 110 also provides mechanical strength and support for processing of the back side 60 of the device substrate 40 as discussed below. After bonding, the device substrate 40 and the carrier substrate 110 may optionally be annealed to enhance bonding strength.

Still referring to FIG. 3, after the carrier substrate 110 is bonded, a thinning process 120 is then performed to thin the device substrate 40 from the backside 60. The thinning process 120 may include a mechanical grinding process and a chemical thinning process. A substantial amount of substrate material may be first removed from the device substrate 40 during the mechanical grinding process. Afterwards, the chemical thinning process may apply an etching chemical to the back side 60 of the device substrate 40 to further thin the device substrate 40 to a thickness 130, which is on the order of a few microns. In some embodiments, the thickness 130 is greater than about 1 um but less than about 3 um. It is also understood that the particular thicknesses disclosed in the present disclosure are mere examples and that other thicknesses may be implemented depending on the type of application and design requirements of the image sensor device 30.

Figure 4:
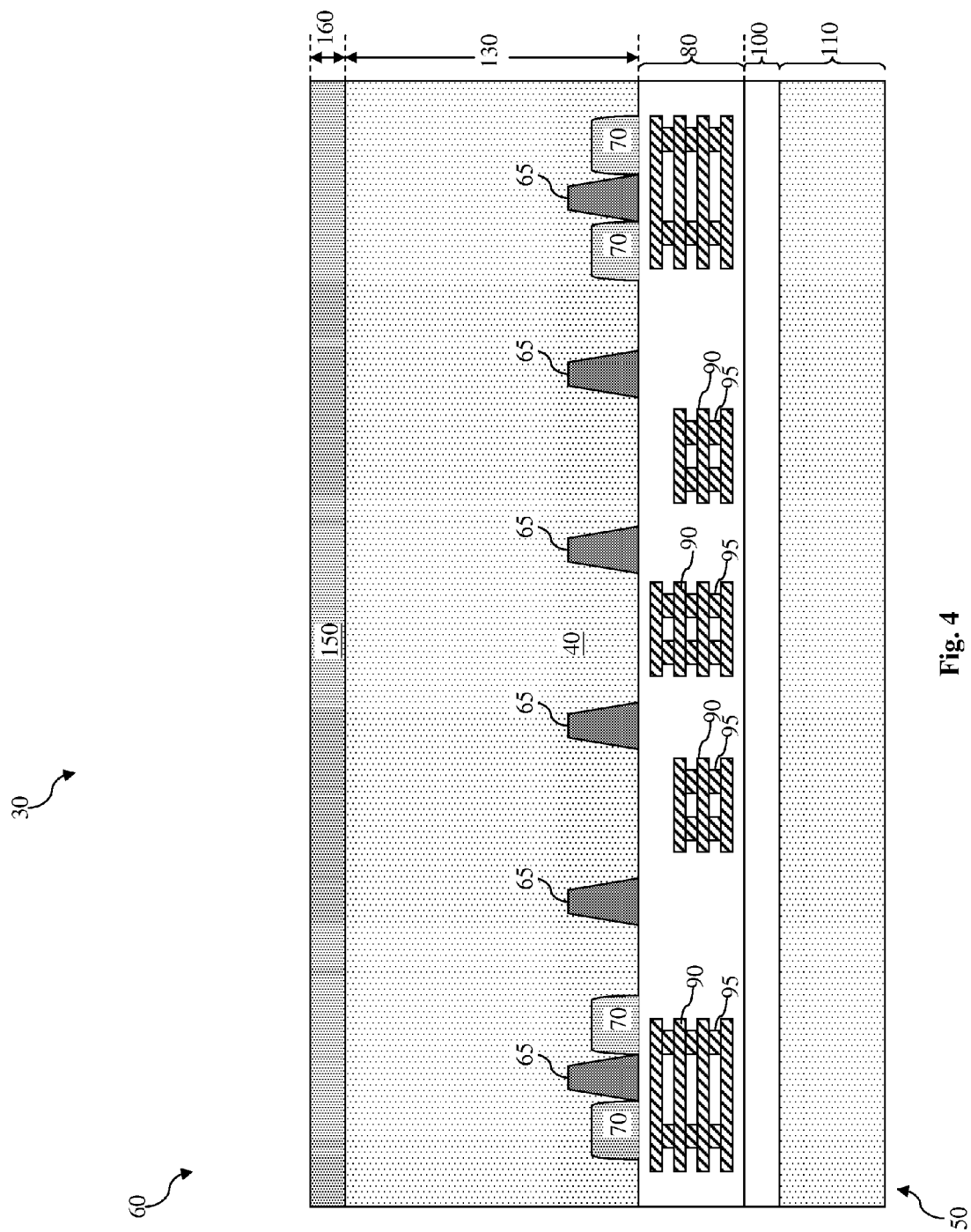

Referring now to FIG. 4, an anti-reflective coating (ARC) layer 150 is formed over the device substrate 40 from the back side 60. The ARC layer 150 may be formed by a suitable deposition process, such as CVD, PVD, ALD, or combinations thereof. The ARC layer 100 may include a suitable material for reducing a reflection of radiation waves projected toward the device substrate 40 from the back side 60. For example, the ARC layer 150 may contain nitrogen. The ARC layer 150 may also serve as an etching-stop layer. The ARC layer 150 has a thickness 160. In some embodiments, the thickness 160 is greater than about 200 Angstroms but less than about 1000 Angstroms.

Figure 5:
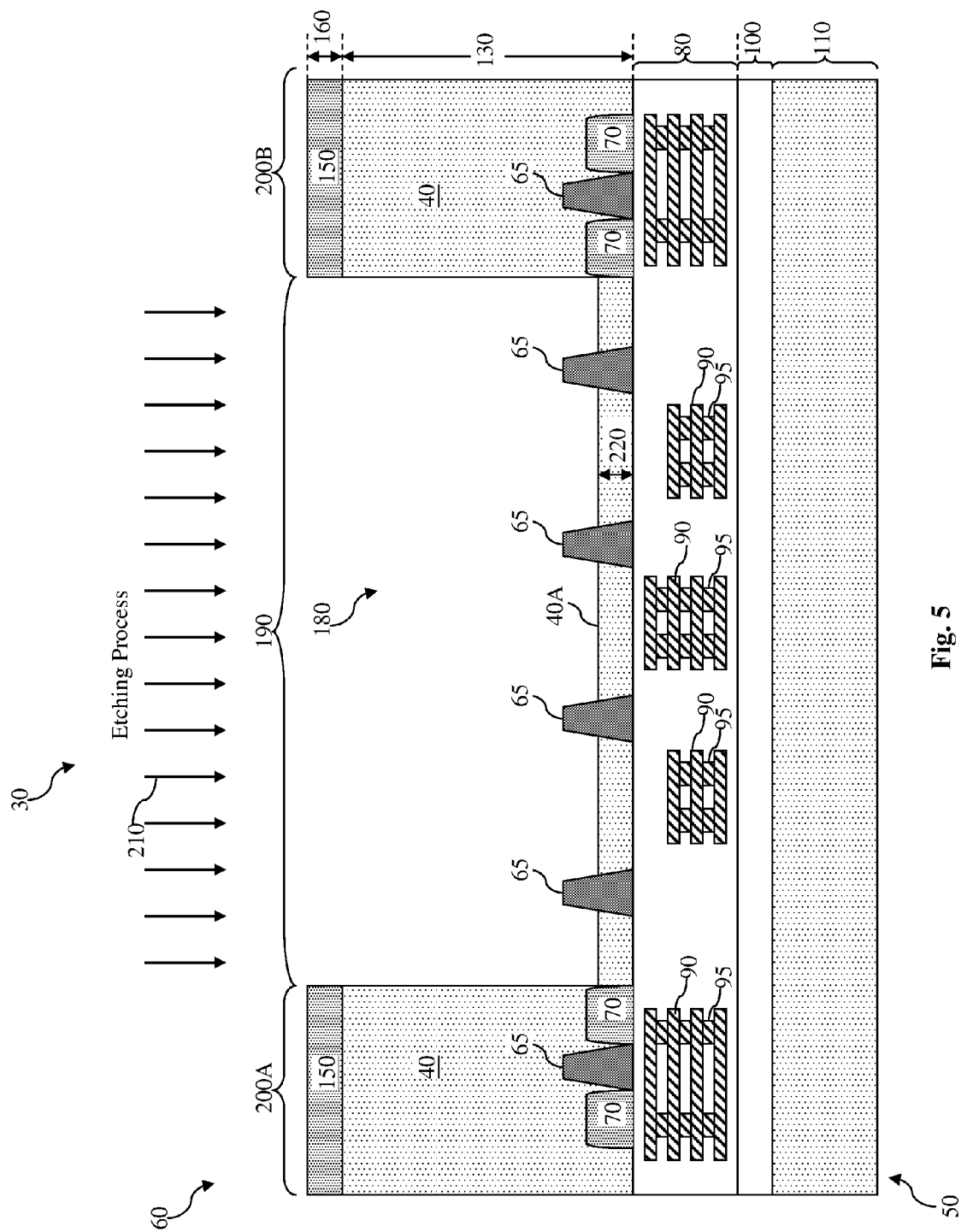

Referring now to FIG. 5, an opening 180 is formed in the device substrate 40. The opening 180 is formed in a scribe-line region 190 of the image sensor device 30. In general, the scribe line region is a region that separates one semiconductor die from an adjacent semiconductor die. The scribe line region is cut therethrough in a later fabrication process to separate adjacent dies before the dies are packaged and sold as integrated circuit chips. In comparison, the portions of the substrate 40 located on either side of the opening 180 belong to pixel regions 200A and 200B of the image sensor device 30, since these portions of the substrate 40 contain radiation-sensitive pixels that can sense light. Thus, the portion of the image sensor device 30 illustrated herein contains adjacent dies (whose pixel regions are respectively shown herein as pixel regions 200A and 200B) that are divided apart by the scribe-line region 190.

It is understood that in addition to the pixel regions 200A-200B and the scribe line region 190, the image sensor device 30 may also include periphery regions and bonding pad regions. The periphery region may include digital devices, such as application-specific integrated circuit (ASIC) devices or system-on-chip (SOC) devices, or other reference pixels used to establish a baseline of an intensity of light for the image sensor device 30. The bonding pad region is reserved for the formation of bonding pads, so that electrical connections between the image sensor device 30 and external devices may be established. For the sake of simplicity, the details of these other regions of the image sensor device 30 are not illustrated or described herein.

Referring back to FIG. 5, the opening 180 is formed by an etching process 210. The etching process 210 includes a dry etching process in some embodiments. The etching process 210 is performed in a manner so that the substrate 40 is not entirely removed in the scribe-line region 190. Rather, a portion of the substrate 40A remains in the scribe-line region 190 (over the interconnect structure 80) even after the etching process 200 is performed. This may be carried out by tuning certain etching parameters of the etching process 210, for example the etching time of the etching process 210. The substrate portion 40A has a thickness 220. In some embodiments, the thickness 220 is greater than about 0 Angstroms but less than 4000 Angstroms. This substrate portion 40A is contiguous and in direct physical contact with the portions of the substrate 40 in the pixel region 200s.

In this manner described above, the fabrication method according to the various aspects of the present disclosure "reserves" a substrate portion 40A in the scribe-line region 190. This reserved portion of the substrate 40A can reduce dark current, as discussed in more detail below.

Figure 6:
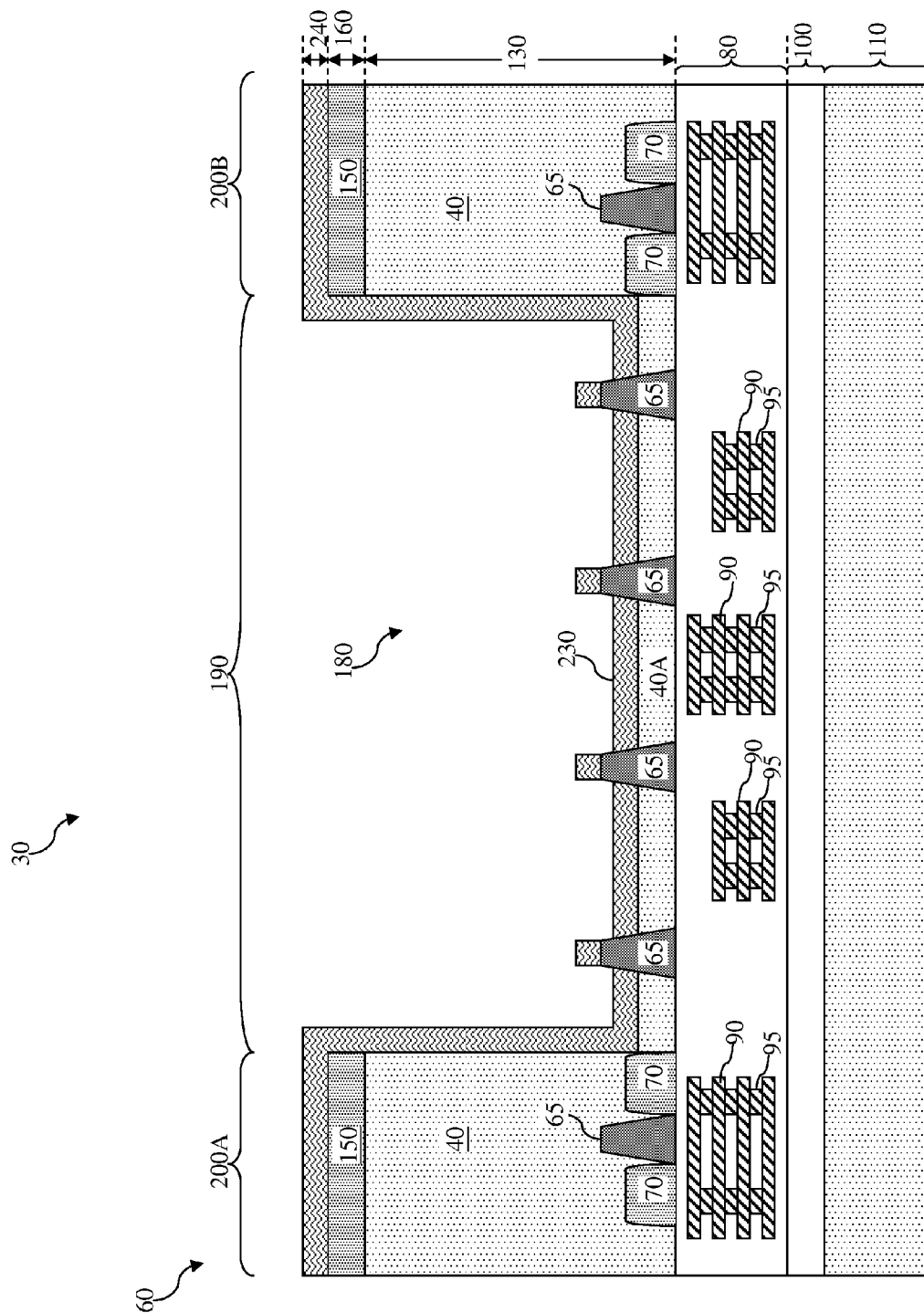

Referring now to FIG. 6, an anti-reflective coating (ARC) layer 230 is formed over the anti-reflective layer 150 in the pixel region 200 and over the substrate portion 40A in the scribe-line region 190. The ARC layer 230 is also formed on the sidewalls of the portions of the substrate 40 in the pixel region 200. The ARC layer 230 may be formed by a suitable deposition process, such as CVD, PVD, ALD, or combinations thereof. The ARC layer 230 may include a suitable material for reducing a reflection of radiation waves projected toward the device substrate 40 from the back side 60. For example, the ARC layer 230 may contain nitrogen. In some embodiments, the ARC layers 150 and 230 have different material compositions. The ARC layer 230 has a thickness 240. In some embodiments, the thickness 240 is greater than about 200 Angstroms but less than about 3000 Angstroms.

Figure 7:
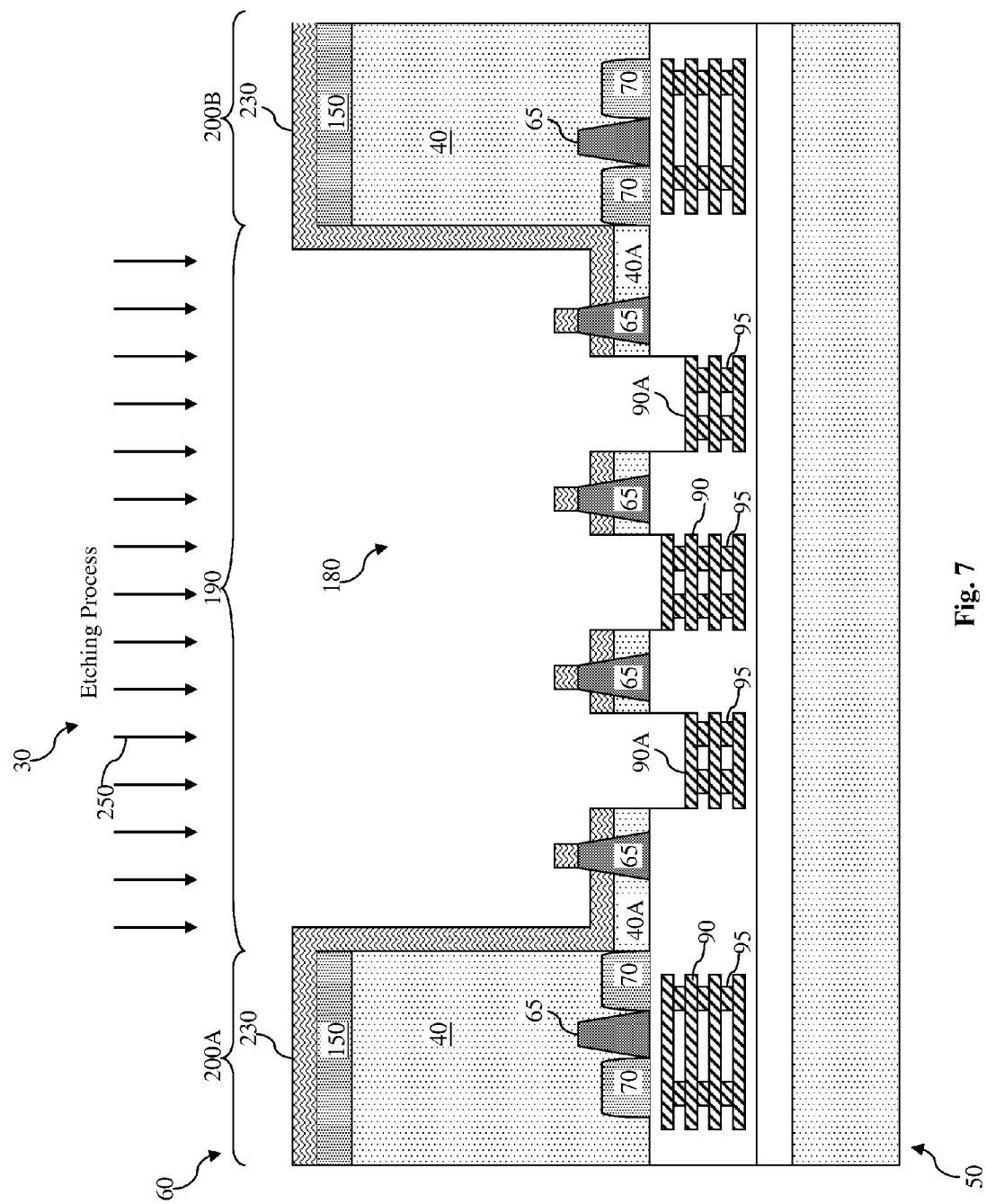

Referring now to FIG. 7, an etching process 250 is performed in the scribe-line region 190 to "open" bonding pads 90A, which are a subset of the metal lines of the interconnect structure 80 in the scribe-line region 190. In other words, the etching process 250 removes the portions of the ARC layers 230 and 150, and portions of the oxide material located above the bonding pads 90A, so that the upper surfaces of the bonding pads 90A are exposed. The bonding pads 90A may be wire-bonded later to establish electrical connections to the image sensor device 30. In some embodiments, the etching process 250 includes a dry etching process.

Figure 8:
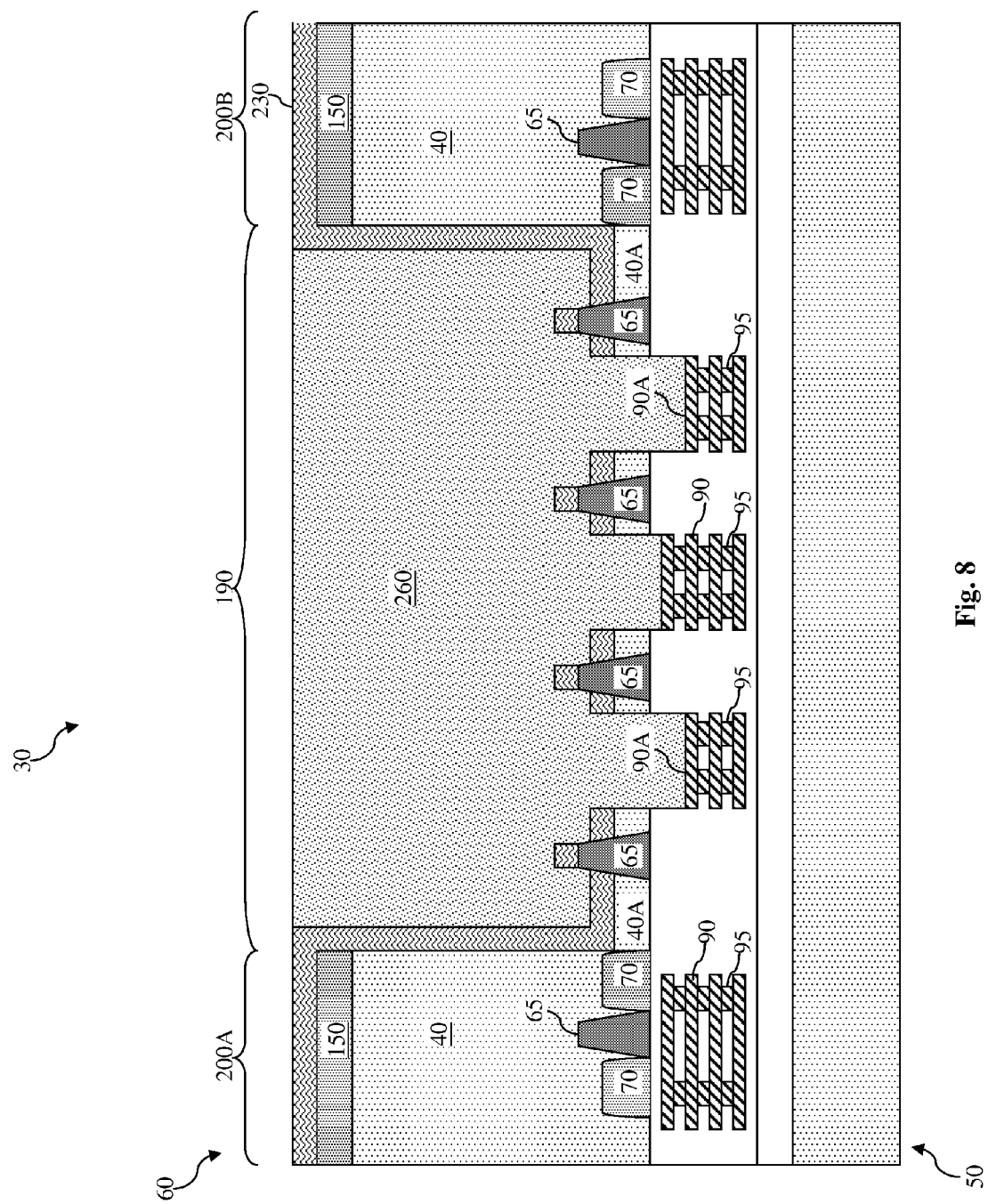

Referring now to FIG. 8, an organic material 260 is formed to fill the opening 180 in the scribe-line region 190. The organic material 260 is formed besides the substrate 40 in the pixel region 200A and over the retained substrate portion 40A. However, the ARC layer 230 separates the organic material 260 from the substrate 40 in the pixel region 200A and from the retained substrate portion 40A in the scribe-line region 190.

The organic material 260 is formed for purposes of creating a flat surface for the formation of a color filter layer. In some embodiments, the organic material 260 may have the same material composition as the color filter layer and may be formed using the same processes that form the color filter layer. The color filter layer may be formed on the back side 60 of the substrate 40 and over the ARC layer 150. The color filter layer may contain a plurality of color filters that may be positioned such that the incoming radiation is directed thereon and therethrough. The color filters may include a dye-based (or pigment based) polymer or resin for filtering a specific wavelength band of the incoming radiation, which corresponds to a color spectrum (e.g., red, green, and blue). In alternative embodiments, the color filter layer may contain a different material than the organic material 260 and may be formed separately (i.e., after) the organic material 260 is formed. For the sake of simplicity, the color filter layer is not specifically illustrated herein.

After the formation of the color filter layer, a micro-lens layer containing a plurality of micro-lenses is formed over the color filter layer. The micro-lenses direct and focus the incoming radiation toward specific radiation-sensing regions in the device substrate 40. The micro-lenses may be positioned in various arrangements and have various shapes depending on a refractive index of a material used for the micro-lens and distance from a sensor surface. The device substrate 40 may also undergo an optional laser annealing process before the forming of the color filter layer or the micro-lens layer. It is understood that both the color filter layer and the micro-lenses are formed in the pixel regions 200A-200B of the image sensor device 30. For reasons of simplicity, the micro-lenses are not specifically illustrated herein either.

Figure 9:
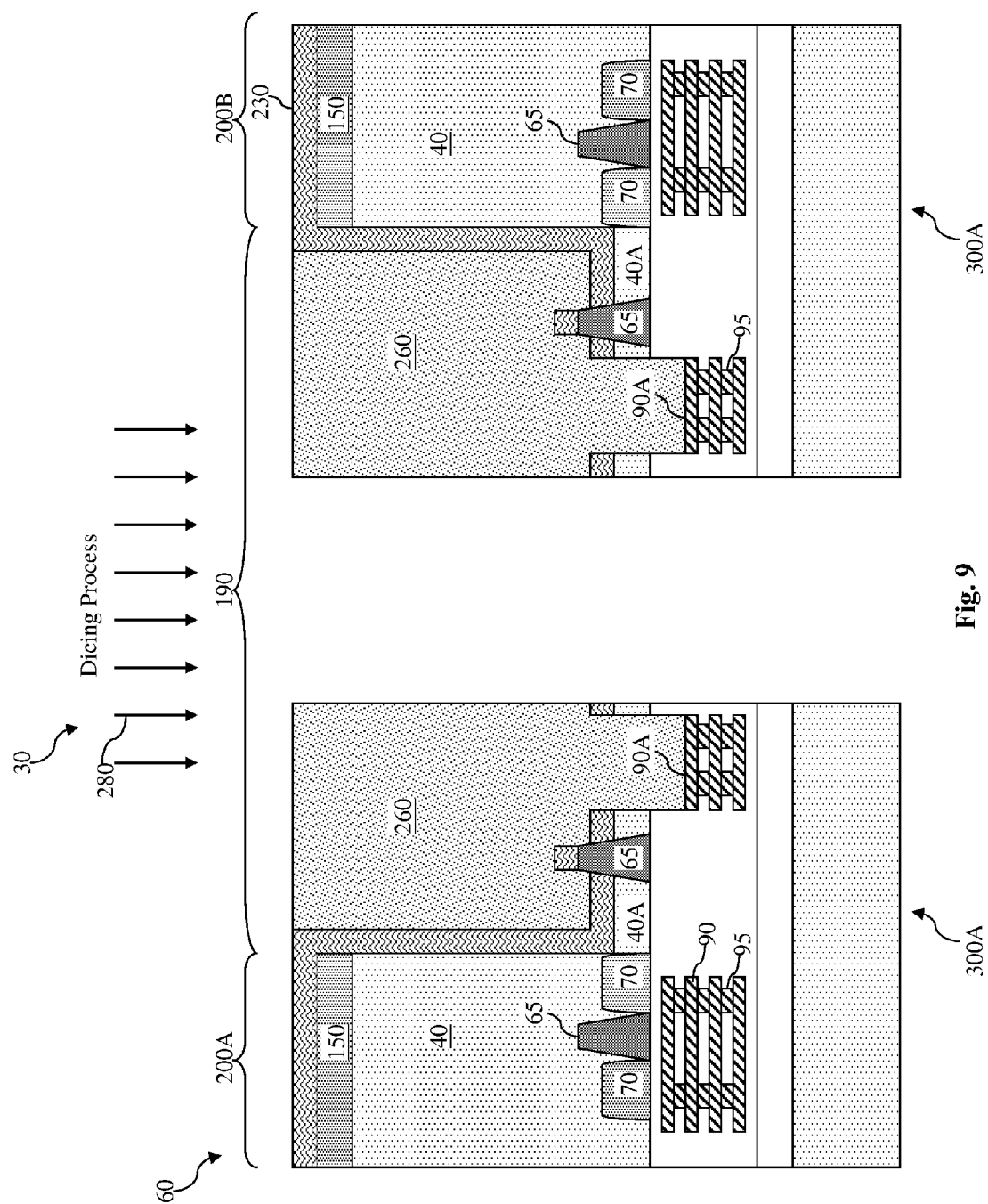

Referring now to FIG. 9, a dicing process 280 is performed to the scribe-line region 190 so as to divide the image sensor device 30 into separate image sensor dies 300A and 300B. The dicing process 280 may include a wafer sawing process in some embodiments. The wafer sawing may be carried out using a blade, a laser beam, or another suitable mechanism. The dicing process 280 is performed in a manner so as to not damage the image sensor device 30, for example the sidewalls of the image sensor dies 300A and 300B.

The embodiments discussed above offer advantages over conventional image sensor devices, for example advantages in dark current performances. However, it is understood that not all advantages are necessarily discussed herein, and other embodiments may offer different advantages, and that no particular advantage is required for all embodiments.

Dark current is a common type of image sensor defect and may be defined as the existence of pixel current when no actual illumination is present. In other words, the pixel "detects" light when it is not supposed to. Dark current defects may be caused by stress in conventional image sensors. In more detail, the organic material filling the scribe-line region for conventional image sensors may have a high coefficient of thermal expansion. Thus, as temperature rises, the organic material expands in various directions, including in a lateral direction. The lateral expansion of the organic material causes stress to the radiation-sensing devices of the pixel region. This stress may induce a bandgap of a charge carrier to be narrowed, which may result in carrier leakage and therefore give rise to dark current in conventional image sensors.

In comparison, the image sensor device 30 discussed above minimizes dark current problems by not completely removing all portions of the substrate 40 in the scribe-line region 190. In more detail, a substrate portion 40A is retained when the scribe-line region 190 is etched. The retained substrate portion 40A substantially reduces the amount of stress (caused by organic material expansion) that is delivered to the radiation-sensing regions 70. One of the reasons why lateral stress is reduced is that the retained substrate portion 40A has the same material composition as the substrate 40 and therefore does not have a thermal expansion coefficient as high as that of the organic material 260. Hence, even as temperature rises, the substrate portion 40A causes substantially no stress to the radiation-sensing region 70 nearby. Another reason is that the retained substrate portion 40A separates the radiation-sensing region 70 from the organic material 260 in the scribe-line region 190. Such separation effectively provides a "buffer" for stress caused by the thermal expansion of the organic material 190. Therefore, the amount of lateral stress experienced by the radiation-sensing region 70 may be reduced by the retained substrate portion 40A. For at least the reasons discussed above, due to the retained substrate portions 40A, the amount of lateral stress is reduced for each image sensor die 300A-300B, and consequently dark current performance is improved.

It is understood that the thickness of the retained substrate portion 40A in the scribe-line region may be correlated with the amount of stress experienced by each of the image sensor dies 300A-300B. Typically, a thicker substrate portion 40A results in a smaller lateral stress for the image sensor dies 300A-300B. However, the substrate portion 40A cannot be too thick, because an excessive thickness may prevent the bonding pads 90A from being "opened" as discussed above with reference to FIG. 7. In other words, if the retained substrate portion 40A is too thick, then the etching process 250 may not be able to completely etch away the layers covering the bonding pads 90 to expose their surfaces.

On the other hand, if the substrate portion 40A is too thin, then it may not sufficiently reduce lateral stress against the image sensor dies 300A-300B. Thus, a careful tradeoff must be made. As discussed above, according to the various aspects of the present disclosure, a thickness range of between about 0 Angstroms and 4000 Angstroms has been found to be suitable for reducing lateral stress while not interfering with bonding pad opening. It is understood, however, that other thickness ranges for the retained substrate portion 40A may be used for alternative embodiments to accommodate different design requirements and manufacturing concerns. For example, in embodiments where the bonding pad opening is not a concern, the thickness of the retained substrate portion 40A may be substantially greater than the range discussed herein, and possibly approaching the thickness of the substrate of the image sensor dies.

Another advantage of the embodiments of the present disclosure is that they are fully compatible with existing manufacturing processes. The implementation of the embodiments of the present disclosure merely involves tweaking existing fabrication processes. Therefore, no additional manufacturing equipment is needed, nor are additional fabrication steps performed. Consequently, the present disclosure does not increase fabrication costs or lengthen fabrication time.

It is understood that the sequence of the fabrication processes described above is not intended to be limiting. Some of the layers or devices may be formed according to different processing sequences in other embodiments than what is shown herein. Furthermore, some other layers may be formed but are not illustrated herein for the sake of simplicity.

One of the broader forms of the present disclosure involves an apparatus that includes: a semiconductor image sensor device having a non-scribe-line region and a scribe-line region, the semiconductor image sensor device including: a first substrate portion disposed in the non-scribe-line region, wherein the first substrate portion contains a doped radiation-sensing region; and a second substrate portion disposed in the scribe-line region, wherein the second substrate portion has the same material composition as the first substrate portion In some embodiments, the scribe-line region is disposed adjacent to the non-scribe-line region.

In some embodiments, the first substrate portion and the second substrate portion each contain silicon.

In some embodiments, the second substrate portion is thinner than the first substrate portion.

In some embodiments, the first substrate portion has a first thickness less than about 3 microns; and the second substrate portion has a second thickness less than about 4000 Angstroms.

In some embodiments, the first substrate portion is in direct physical contact with the second substrate portion.

In some embodiments, the image sensor device further comprises: an organic portion disposed in the scribe-line region and over the second substrate portion.

In some embodiments, the image sensor device further comprises: an interconnect structure disposed over a front side of the first substrate portion and the second substrate portion; and an anti-reflective layer disposed over a back side of the first substrate portion and the second substrate portion.

Another one of the broader forms of the present disclosure involves an image sensor device that includes: a radiation-sensing region located in a silicon substrate, the radiation-sensing region being operable to sense radiation projected from a back side of the silicon substrate; a silicon component located adjacent to the silicon substrate; an organic component located over a back side of the silicon component; and an interconnect structure located over a front side of the silicon substrate and a front side of the silicon component; wherein: the radiation-sensing region is located in a pixel region of the image sensor device; and the silicon component and the organic component are located in a scribe-line region of the image sensor device.

In some embodiments, the image sensor device of further comprises: an anti-reflective coating (ARC) layer located over the back side of the silicon substrate, wherein the silicon substrate is separated from the organic component by a portion of the ARC layer.

In some embodiments, the silicon component is at least partially separated from the organic component by another portion of the ARC layer.

In some embodiments, the silicon substrate is contiguous with the silicon component.

In some embodiments, the interconnect structure includes one or more bonding pads.

In some embodiments, the silicon component is substantially thinner than the silicon substrate.

Still another of the broader forms of the present disclosure involves a method of fabricating an image sensor device, the method includes: forming a plurality of radiation-sensing regions in a substrate, the radiation-sensing regions being formed in a non-scribe-line region of the image sensor device; forming an opening in a scribe-line region of the image sensor device by etching the substrate in the scribe-line region, wherein a portion of the substrate remains in the scribe-line region after the etching; and filling the opening with an organic material.

In some embodiments, the portion of the substrate in the scribe-line region is in direct physical contact with the substrate in the non-scribe line region.

In some embodiments, the portion of the substrate in the scribe-line region is thinner than the substrate in the non-scribe line region.

In some embodiments, the method further comprises: forming a color filter layer over the non-scribe-line region of the substrate, wherein the color filter layer and the organic material have the same material compositions.

In some embodiments, the radiation-sensing regions are formed from a front side of the substrate; and the method further comprises, before the forming the opening and after the forming the radiation-sensing regions: forming an interconnect structure over the front side of the substrate; bonding the substrate to a carrier substrate, the interconnect structure being bonded between the substrate and the carrier substrate; and thinning the substrate from a back side, the back side being opposite from the front side.

In some embodiments, the method further comprises, after the filling the opening: performing an etching process to the organic material to expose a bonding pad of the interconnect structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus comprising:
    a semiconductor image sensor device having a non-scribe-line region and a scribe-line region, the scribe-line region being a region that separates one semiconductor die from an adjacent semiconductor die, the semiconductor image sensor device including:
        a first substrate portion disposed in the non-scribe-line region, wherein the first substrate portion contains a doped radiation-sensing region; and
        a second substrate portion disposed in the scribe-line region, wherein the second substrate portion has the same material composition as the first substrate portion.

2. The apparatus of claim 1, wherein the scribe-line region is disposed adjacent to the non-scribe-line region.

3. The apparatus of claim 1, wherein the first substrate portion and the second substrate portion each contain silicon.

4. The apparatus of claim 1, wherein the second substrate portion is thinner than the first substrate portion.

5. The apparatus of claim 4, wherein:
    the first substrate portion has a first thickness less than about 3 microns; and
    the second substrate portion has a second thickness less than about 4000 Angstroms.

6. The apparatus of claim 1, wherein the first substrate portion is in direct physical contact with the second substrate portion.

7. The apparatus of claim 1, wherein the image sensor device further comprises: an organic portion disposed in the scribe-line region and over the second substrate portion.

8. The apparatus of claim 1, wherein the image sensor device further comprises:
    an interconnect structure disposed over a front side of the first substrate portion and the second substrate portion; and
    a first anti-reflective layer disposed over a back side of the first substrate portion and the second substrate portion.

9. The apparatus of claim 1, wherein the image sensor device further comprises a second anti-reflective layer disposed over the back side of the first substrate portion but not the second substrate portion, the first and second anti-reflective layers containing different materials.

10. The apparatus of claim 1, wherein the first substrate portion and the second substrate portion each contain a semiconductor material.

11. The apparatus of claim 1, wherein the non-scribe-line region includes a pixel region and a bonding pad region.

12. An apparatus comprising:
    a semiconductor image sensor device having a non-scribe-line region and a scribe-line region located adjacent to the non-scribe-line region, the semiconductor image sensor device including:
        a first semiconductor component located in the non-scribe-line region;
        a radiation-sensing element located in the first semiconductor component; and
        a second semiconductor component located in the scribe-line region, wherein the second semiconductor component is in direct physical contact with the radiation-sensing element, and wherein the second semiconductor component is free of having any radiation-sensing elements located therein.

13. The apparatus of claim 12, wherein the first and second semiconductor components have identical material compositions.

14. The apparatus of claim 12, wherein the first semiconductor component and the second semiconductor component each contain silicon, and wherein the radiation-sensing element contains doped silicon.

15. The apparatus of claim 12, wherein the second semiconductor component is at least several times thinner than the first semiconductor component.

16. The apparatus of claim 12, wherein the semiconductor image sensor device further comprises: an organic material located in the scribe-line region.

17. The apparatus of claim 12, wherein the semiconductor image sensor device further comprises:
   metal lines and vias located over a first side of the radiation-sensing element; and
   anti-reflective materials located over a second side of the radiation-sensing element.

18. An apparatus comprising:
   a semiconductor image sensor device having a first region and a second region located adjacent to the first region, the semiconductor image sensor device including:
      a first semiconductor substrate formed in the first region;
      a radiation-sensing element formed in the first semiconductor substrate, the radiation-sensing element being configured to sense radiation that enters the first semiconductor substrate through a back side;
      a second semiconductor substrate formed in the second region, the second semiconductor substrate being at least multiple times thinner than the first semiconductor substrate and having no radiation-sensing elements, the first and second semiconductor substrates having identical material compositions; and
      an organic material formed in the second region but not in the first region.

19. The apparatus of claim 18, wherein the second semiconductor substrate is in direct physical contact with the radiation-sensing element.

20. The apparatus of claim 18, wherein the semiconductor image sensor device further comprises:
   a plurality of interconnect elements formed over a front side of the first semiconductor substrate; and
   anti-reflective materials formed over the back side of the first semiconductor substrate.

* * * * *